(12) United States Patent
Lee et al.

(10) Patent No.: US 7,453,142 B2
(45) Date of Patent: Nov. 18, 2008

(54) SYSTEM AND METHOD FOR IMPLEMENTING TRANSFORMER ON PACKAGE SUBSTRATE

(75) Inventors: See Taur Lee, Allen, TX (US); Solti Peng, Plano, TX (US); Dirk Leipold, Plano, TX (US); James Fred Salzman, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/294,060

(22) Filed: Dec. 5, 2005

(65) Prior Publication Data

US 2007/0128821 A1 Jun. 7, 2007

(51) Int. Cl.
*H01L 23/52* (2006.01)
(52) U.S. Cl. .................. 257/691; 257/531; 257/692; 257/707; 257/E21.022
(58) Field of Classification Search .......... 257/531, 257/678–733, E21.022
See application file for complete search history.

(56) References Cited

U.S. PATENT DOCUMENTS

| | | | | |
|---|---|---|---|---|
| 4,780,795 | A * | 10/1988 | Meinel | 361/765 |
| 5,696,466 | A * | 12/1997 | Li | 330/286 |
| 6,194,774 | B1 | 2/2001 | Cheon | |
| 6,586,309 | B1 | 7/2003 | Yeo et al. | |
| 6,891,461 | B2 | 5/2005 | Gardner | |
| 6,943,658 | B2 | 9/2005 | Gardner | |
| 7,227,240 | B2 * | 6/2007 | Knapp et al. | 257/531 |
| 2003/0005569 | A1 * | 1/2003 | Hiatt et al | 29/602.1 |
| 2005/0062575 | A1 | 3/2005 | Gardner | |
| 2005/0122198 | A1 * | 6/2005 | Zhou et al. | 336/200 |
| 2005/0167828 | A1 * | 8/2005 | Yeo et al. | 257/734 |
| 2005/0236689 | A1 * | 10/2005 | Sugiura et al. | 257/531 |
| 2005/0270806 | A1 * | 12/2005 | Zhu | 363/17 |

* cited by examiner

*Primary Examiner*—H. Jey Tsai
(74) *Attorney, Agent, or Firm*—Ronald O. Neerings; Wade James Brady, III; Frederick J. Telecky, Jr.

(57) ABSTRACT

A transformer system includes a package substrate having a surface. A plurality of electrically conductive pads are arranged in spaced apart relationship relative to each other on the substrate surface. A first winding is defined by a first electrically conductive path between a first input and a first output, the first electrically conductive path including at least one wire connected between at least one first pad pair of the electrically conductive pads. At least one electrically conductive pad of each first pad pair is at the substrate surface. A second winding is defined by a second electrically conductive path between a second input and a second output, the second electrically conductive path including at least one wire connected between at least one second pad pair of the electrically conductive pads. At least one electrically conductive pad of each second pad pair is at the substrate surface. The first and second electrically conductive paths are proximal each other to achieve a magnetic field coupling between the first and second windings so as to form a transformer.

16 Claims, 6 Drawing Sheets

SYSTEM AND METHOD FOR IMPLEMENTING TRANSFORMER ON PACKAGE SUBSTRATE

TECHNICAL FIELD

This invention relates to integrated circuit (IC) packaging, and more specifically to implementing one or more transformers on a package substrate.

BACKGROUND

Transformers are utilized in many applications such as for changing the voltage of alternating current electricity. A transformer has one or more primary windings and one or more secondary windings. The primary winding(s) receives electrical energy, such as from a power source and couples this energy to the secondary winding(s) by means of a changing magnetic field. The energy appears as an electromagnetic force across the winding. Typical transformers are implemented using an arrangement of coils, such as may be arranged so as to be juxtaposed. Alternatively, the coils may be arranged so that one coil surrounds another coil. The extent to which magnetic field generated at one winding links the other winding is expressed in terms of the winding's coupling coefficient.

As one example, a transmitter's main RF power amplifier can be implemented as a plurality of parallel-connected RF amplifier modules, whose outputs are combined to produce a composite amplified signal. One or more transformers can be utilized to combine the power from power amplifiers to provide a corresponding aggregate output at a desired power. Demands in many fields, including wireless communications, have prompted design efforts to lower-cost solutions that exhibit the same or better performance but operate with reduced power consumption. The reduced power consumption is often is prompted by further requirements in lowering supply voltages to various integrated circuits. Accordingly, there is a continuing need to provide more efficient, low cost transformers and/or power combiner.

SUMMARY

The present invention relates generally to implementing one or more transformers on a package substrate.

One example embodiment provides a transformer system that includes a package substrate having a surface. A plurality of electrically conductive pads are arranged in spaced apart relationship relative to each other on the substrate surface. A first winding is defined by a first electrically conductive path between a first input and a first output, the first electrically conductive path including at least one wire connected between at least one first pad pair of the electrically conductive pads. At least one electrically conductive pad of each first pad pair is at the substrate surface. A second winding is defined by a second electrically conductive path between a second input and a second output, the second electrically conductive path including at least one wire connected between at least one second pad pair of the electrically conductive pads. At least one electrically conductive pad of each second pad pair is at the substrate surface. The first and second electrically conductive paths are proximal each other to achieve a magnetic field coupling between the first and second windings so as to form a transformer. The transformer can also be implemented so that some of the pads are on a die that is attached to the substrate.

Another example embodiment provides a transformer system that includes a die comprising first and second substantially opposed surfaces and a plurality of electrically conductive die pads arranged in spaced apart relationship relative to each other at a first surface of the die. A substrate has a substantially planar and a plurality of electrically conductive substrate pads arranged in spaced apart relationship relative to each other at the substrate surface, the die being attached to the substrate. A first winding includes wire connecting a first subset of the die pads with a first subset of the substrate pads. A second winding that includes wire connecting a second subset of the die pads with a second subset of the substrate pads, the wire of the first winding being positioned adjacent respective wire of the second winding to form a transformer.

Yet another example embodiment provides a method for implementing a transformer. The method includes providing a package substrate having a surface and attaching a die to the substrate. At least one wire is bonded between at least one first pad pair of electrically conductive pads to form at least a portion of a first electrically conductive path between a first input and a first output, at least one electrically conductive pad of each first pad pair being at the substrate surface. At least one wire is bonded between at least one second pad pair of electrically conductive pads to form at least a portion of a second electrically conductive path between a second input and a second output, at least one electrically conductive pad of each second pad pair being at the substrate surface, the first and second electrically conductive paths being sufficiently magnetically coupled to form respective windings of a transformer. The first and second electrically conductive paths further can be formed by wires that interconnect corresponding first and second pad pairs, a portion of which pads are on the die and another portion of which are on the substrate.

The foregoing examples as well as others contained herein can be utilized to provide a low cost, high efficiency, low loss transformer and/or power combiner using wire or a combination of wire and substrate traces.

DETAILED DESCRIPTION

The present invention relates to an approach for implementing one or more transformers. For example, the transformer can be constructed using existing and future packaging technology to form a transformer at least partially on a package substrate, such as using of bonding wires and/or substrate traces. An arrangement of such transformers can be provided in a single IC package, such as to implement a power combiner or power splitter. Other circuitry that includes one or more transformers can also be implemented in the package based on the teachings contained herein.

Figure 1:
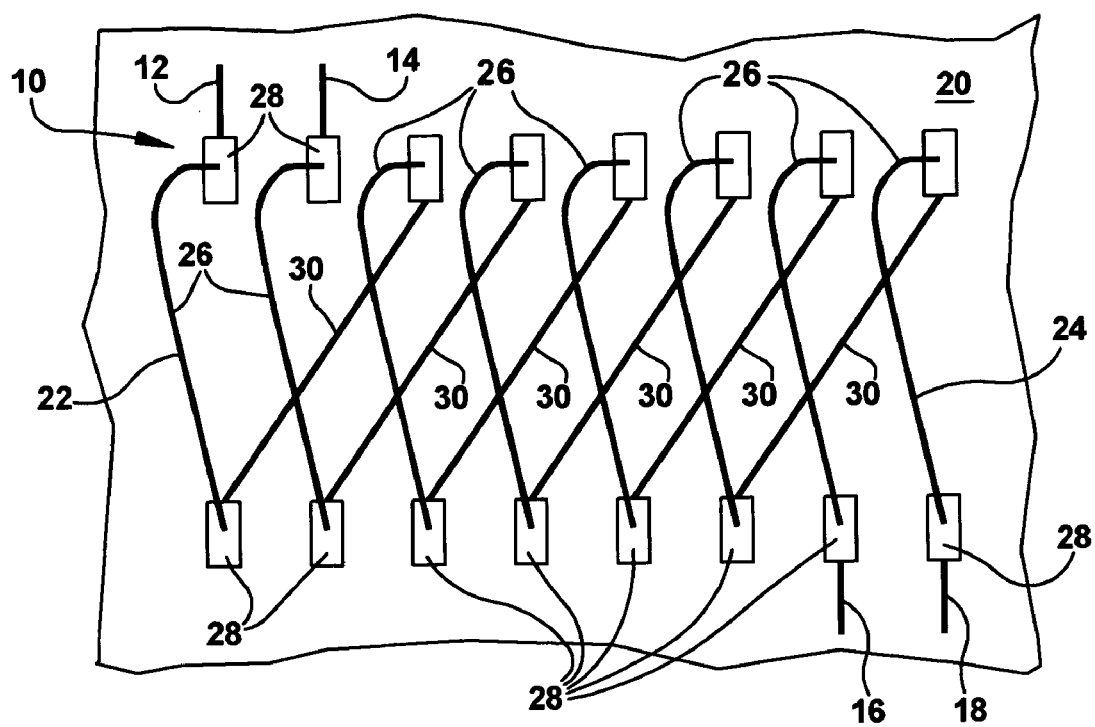
FIG. 1 depicts a first example of a transformer that can be implemented according to an aspect of the present invention.

FIG. 1 depicts an example of a transformer 10 that can be implemented according to an aspect of the present invention. The transformer 10 includes a pair of inputs 12 and 14 and a pair of outputs 16 and 18. The transformer 10 is implemented on a package substrate 20 using an arrangement of electrically conductive wires. The wires can be implemented as bonding wires, electrical traces (e.g., wire on the surface of or sandwiched inside the substrate), or a combination of bonding wires and electrical traces. Such wires can be formed of gold, copper, aluminum or other electrical conductors as well as compounds thereof The package substrate 20 is formed of an insulator material. As used herein, the term "insulator material" corresponds to a material that exhibits poor conductance of electricity. Those skilled in the art will understand and appreciate various types of insulating materials that can be employed to form the package substrate 20. For example, the package substrate 20 can be formed of a variety of materials, such as ceramics, plastics, BT resin or so called "green board", fiberglass, tapes, insulating interposers, films, epoxies and epoxy blends, or other suitable electrically-insulating materials, all of which can be considered non-semiconductor and insulator materials. The particular substrate material and its configuration may vary according to the type of IC package in which the transformer 10 is being implemented. For example, the package can be one of a variety of different types of packages, including single in-line package (SIP), dual in-line package (DIP), thin small outline package (TSOP), quad flatback (QFP) package, plastic leaded chip carrier (PLCC), leadless chip carrier (LCC), pin grid array (PGA) package, ball grid array (BGA) package, ceramic dual-in-line frit seal packages (CERDIP), flip chip package.

The transformer 10 includes a primary winding 22 which is formed of the electrically conductive path extending between the input 12 and the output 16. The transformer 10 also includes a secondary winding 24 that includes an electrically conductive path between the input 14 and the output 18. In the example, of FIG. 1, each of the windings 22 and 24 includes bonding wires 26, electrically conductive pads 28 and electrical traces 30. The wires 26 and the electrical traces 30 connect a corresponding pair of electrically conductive pads (i.e., a pad pair). As used herein, the term "electrically conductive pad" and variations thereof is intended to include bonding pads on a die, bond fingers or leadframe pads on a package substrate, with the particular location being evident from context and usage. The pads 28 can be formed of electrically conductive material, such as aluminum or aluminum-based compounds, although other electrically conductive materials can also be used.

By way of further example, the primary winding 22 includes the electrically conductive path that includes an alternating arrangement of wires 26 and electrically conductive traces 30 connected between respective pairs of electrically conductive pads 28. The wires 26 are formed as one or more lengths of wire extending a predetermined loop height above the surface of the substrate 20 interconnecting the respective pads 28. Additionally, by connecting the wires 26 to the pads 28 substantially perpendicular to the surface of the substrate 20, the electromagnetic field that penetrates the substrate can be reduced relative to conventional spiral inductors. Those skilled in the art will understand and appreciate various ways in which the wires 26 may be bonded to the respective pads 28 including, for example, thermocompression bonding, ultrasonic bonding, and thermosonic ball bonding, to name a few. As a result, existing packaging tools can be employed to form the transformer 10.

The secondary winding 24 can be formed similarly to the primary winding 22. As depicted in FIG. 1, the secondary winding includes of electrically conductive wires 26 connected between respective pairs of pads 28 and electrically conductive traces 30 extending between other pad pairs to form the electrical paths between input 14 and the output 18. As with the primary winding 22, the wires 26 in the secondary winding form arcs of one or more wires extending a predetermined distance above the substrate surface and over the electrically conductive traces 30.

With the approach shown and described in FIG. 1, it will be understood and appreciate that a 1:n transformer can be implemented, where n denotes the transformation ratio of the transformer. The concept further may be extended to provide an N 1:n transformer where the primary or secondary windings are connected in series (N denotes the number of inputs). The operation of the transformer, corresponding to the transfer of energy between coupled windings 22 and 24, can be expressed as follows:

$$n = k\left(\sqrt{\frac{L1}{L2}}\right)$$

where n denotes a transformation ratio for the transformer,
L1=the inductance of the primary winding,
L2=the inductance of the secondary winding, and
k=the coupling factor.

Thus, where the same types and configuration of bond wires and traces are utilized to implement each of the windings (e.g., L1=L2), the transformation ratio "n" approximates the coupling factor.

To implement a transformer with practicable effects, the coupling factor "k" should be greater than or equal to approximately 0.3. The transformer coupling coefficient "k" can be improved by increasing the number of turns, implementing tighter pitch of bond fingers and a cross sectional area of the transformer, such as by increasing the bond wire height, wire diameter and/or the length of the respective bond wires. Table 1 provides an example of possible design specifications that can be utilized in implementing the transformer 10 (as well as for implementing other examples of transformers shown and described herein). For the example transformer of FIG. 1, the transformer 10 can include a bond finger pitch of about 110 micrometers, a bond wire loop height of about 175 micrometers (relative to the substrate surface), a substrate thickness of about 100 micrometers and a substrate line width of about 50 micrometers.

TABLE 1

| SPECIFICATIONS | RULES |
| --- | --- |
| Bond finger pitch | 50 to 200 micrometers |
| Bond wire loop height | 50 to 500 micrometers |
| Substrate thickness | 10 to 500 micrometers |
| Substrate trace line width | 10 to 100 micrometers |
| Bond wire thickness (diameter) | 10 to 100 micrometers |

Figure 2:
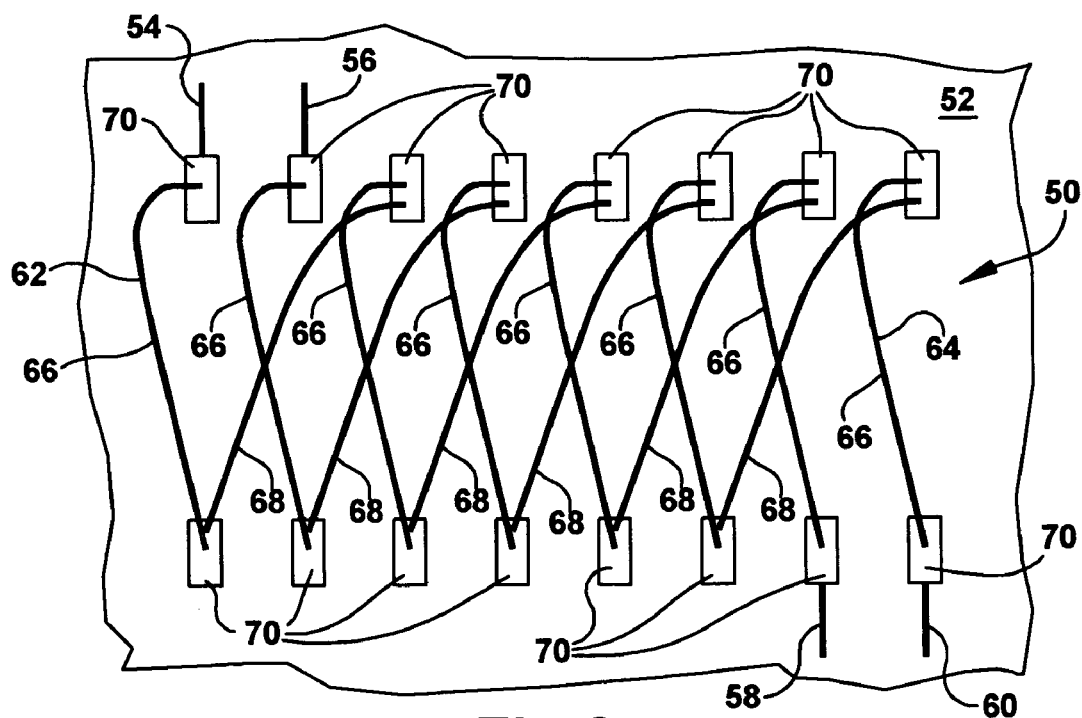
FIG. 2 depicts a second example of a transformer that can be implemented according to an aspect of the present invention.

FIG. 2 depicts an example of another type of transformer 50 that can be implemented according to an aspect of the present invention. The transformer 50 is implemented on a package substrate 52, such as described with respect to FIG. 1. the transformer 50 includes a pair of inputs 54 and 56 and corresponding outputs 58 and 60. The electrical path between the input 54 and the output 58 defines a primary winding and the electrical path between the input 56 and the output 60 defines a secondary winding of the transformer 50. Each of the primary and secondary windings 62 and 64 are implemented by interconnecting bond pads 70 using respective bond wires 66 and 68 (without any electrical traces on the substrate 52).

By using wires (e.g., bond wires) 66 and 68 only to complete the primary and secondary windings 62 and 64 of the transformer 50, thicker copper (or other metal) for the substrate traces are not required. The absence of the traces from the windings 66 and 68 helps to increase the self-resonance frequency of the transformer 50. It is to be understood and appreciated that the respective wires for each of the primary and secondary windings 66 and 68 may have the same or different thicknesses, such as within the ranges provided by Table 1.

Each of the bond wires 66 and 68 is connected between a respective pair of electrically conductive pads 70. In the example of FIG. 2, the bond wire 66 is implemented as having a higher bond wire loop height than the bond wire 68. The loop height of the respective wires 66 and 68 can be implemented in the transformer consistent with the range given by Table 1. As one example, the typical loop height for the higher bond wire 66 may be approximately 275 micrometers and the lower bond wire 68 may be about 75 micrometers, corresponding to a difference in loop height of about 200 micrometers. The particular distance between coupled bond wires may vary according to the packaging technology available for bonding the wires between pads 70 (including conventional or future technologies).

While the foregoing examples (FIGS. 1 and 2) depict use of a single length of wire to interconnects bond fingers or pads, it is to be understood and appreciated that multiple parallel wires can be utilized interconnect the electrically conductive pads.

Figure 3:
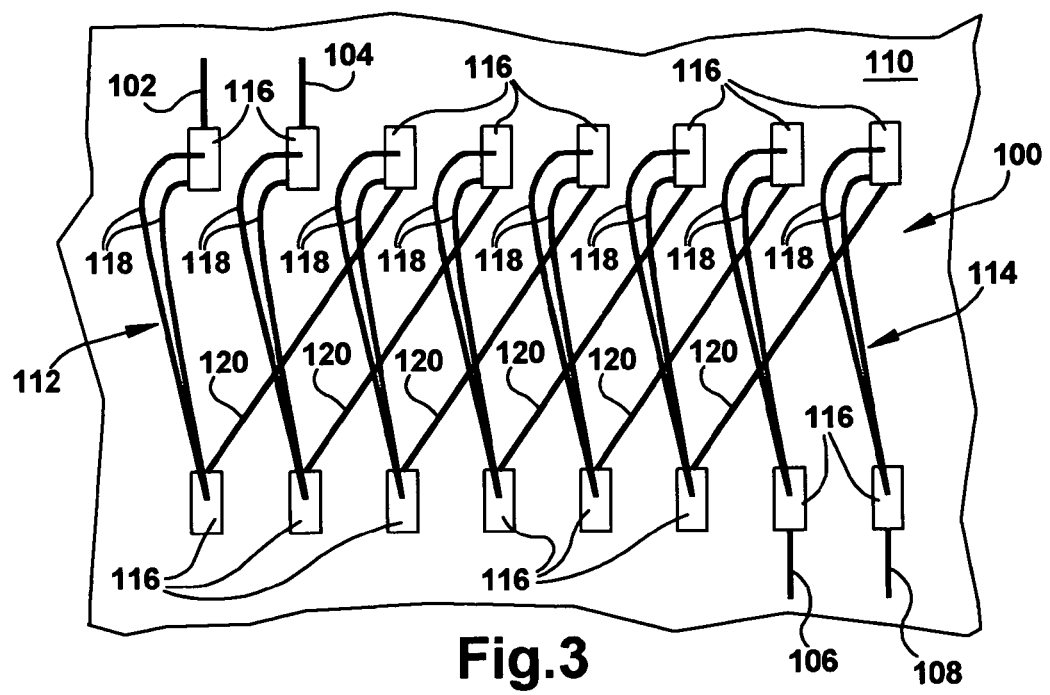
FIG. 3 depicts a third example of a transformer that can be implemented according to an aspect of the present invention.

FIG. 3 depicts an example of a transformer 100 that includes a pair of inputs 102 and 104 connected with respective outputs 106 and 108. As in the preceding examples, the transformer 100 is constructed on a surface of a package substrate 110. A plurality of electrically conductive pads 116, such as bond pads or fingers are arranged on the surface of the substrate 110. The transformer 100 includes a set of primary windings 112 and secondary windings 114 formed by electrically conductive pads between the respective inputs and outputs.

In the example of FIG. 3, a pair of parallel bond wires 118 is utilized to form the higher loop portion for each of the respective windings 112 and 114. Electrical traces 120 formed at the substrate surface form the lower loop portion of each of the respective windings 112 and 114. That is, each full turn of a given winding 112, 114 includes a pair wires 118 connected between first and second pads 116 and a trace connected between the second pad and a third pad. It is to be understood and appreciated that one or more lengths of wire can be utilized to form the lower loop portion similar to the example of FIG. 2.

While a pair of parallel bond wires is depicted as forming the higher loop path portion, it is to be understood and appreciated that any number of parallel bond wires can be utilized. Additionally, the number of parallel wires utilized for the multi-wire loop portion in each of the primary and secondary can be the same or different.

For the example of FIG. 3, the parallel bond wires are implemented on top of each other, such that self inductances are not exactly the same. At high frequency, the electrical signal will choose the lower inductance path and thus the quality factor may not exactly double. To mitigate this effect, parallel bond wires 118 can be placed side-by-side each other at substantially the same loop height. Another approach to increase the quality factor of the transformer is to increase the thickness or gauge of the bond wire (e.g., equal to or greater than 100 micrometers).

Figure 4:
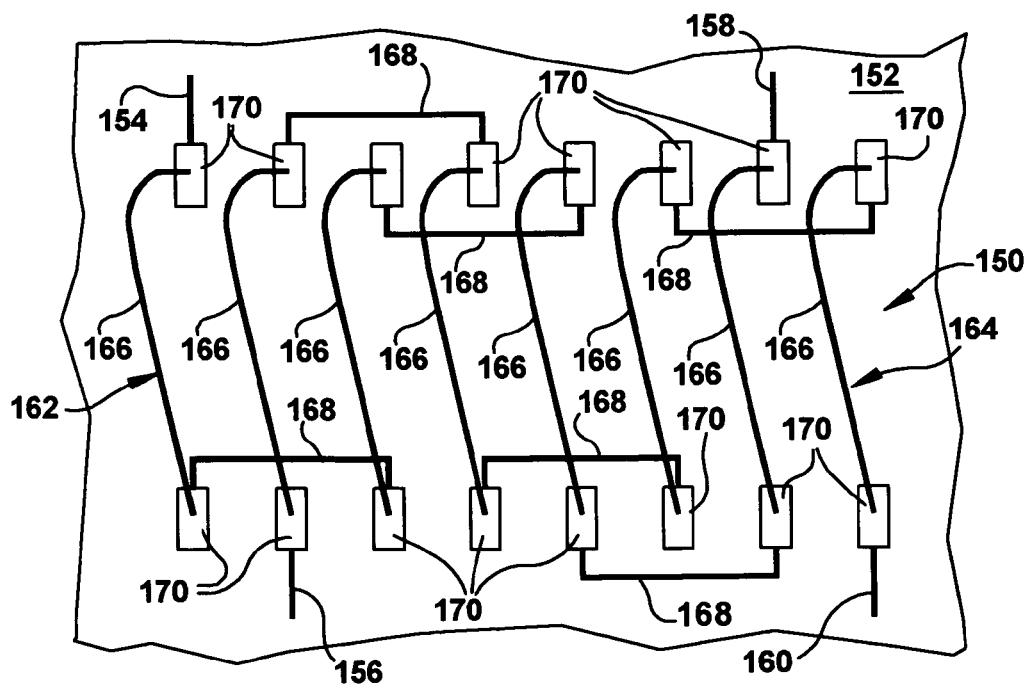
FIG. 4 depicts a fourth example of a transformer that can be implemented according to an aspect of the present invention.

FIG. 4 depicts an example of another transformer 150 that can be implemented according to an aspect of the present invention. The transformer 150 is implemented on a package substrate 152, such as described herein. The transformer 150 corresponds to an opposite winded transformer having the pair of inputs 154 and 156 and corresponding outputs 158 and 160. For instance, the electrically conductive path interconnecting the input 154 and output 158 defines a primary winding 162 and the path between the input 156 and the output 160 defines a secondary winding 164.

As shown in the example of FIG. 4, the primary winding 162 is formed of an arrangement of bond wires 166 and electrically conductive traces 168 that interconnect respective pairs of electrically conductive pads. As in the other examples, the pads 170 are arranged as rows of pads spaced apart from each other in a substantially opposing relationship. Each row may be arranged as a substantially linear array of the pads 170. The primary winding 162 includes a wire interconnecting a first pad 170 and a second pad 170 (opposing pads located in different pad rows) and a conductive trace interconnects the second pad 170 with a third pad 170, which pads are located on the same pad row) and a bond wire interconnects the third pad with a fourth pad, which is located on the opposite row as the second pad. The pattern can repeat accordingly to provide a desired number of turns for the primary winding 162. The secondary winding is formed of a similar arrangement of oppositely wound loop portions, including wires 166, traces 168 and pads 170, such as depicted in FIG. 4. The oppositely wound arrangement of windings 162 and 164 can be utilized to increase the self-resonance frequency of the transformer 150 to provide for desired magnetic coupling, which is useful for high frequency applications. The oppositely wound transformer arrangement shown in FIG. 4 thus operates to differentially connect the coupling capacitance between the primary and secondary windings 162 and 164, respectfully.

Figure 5:
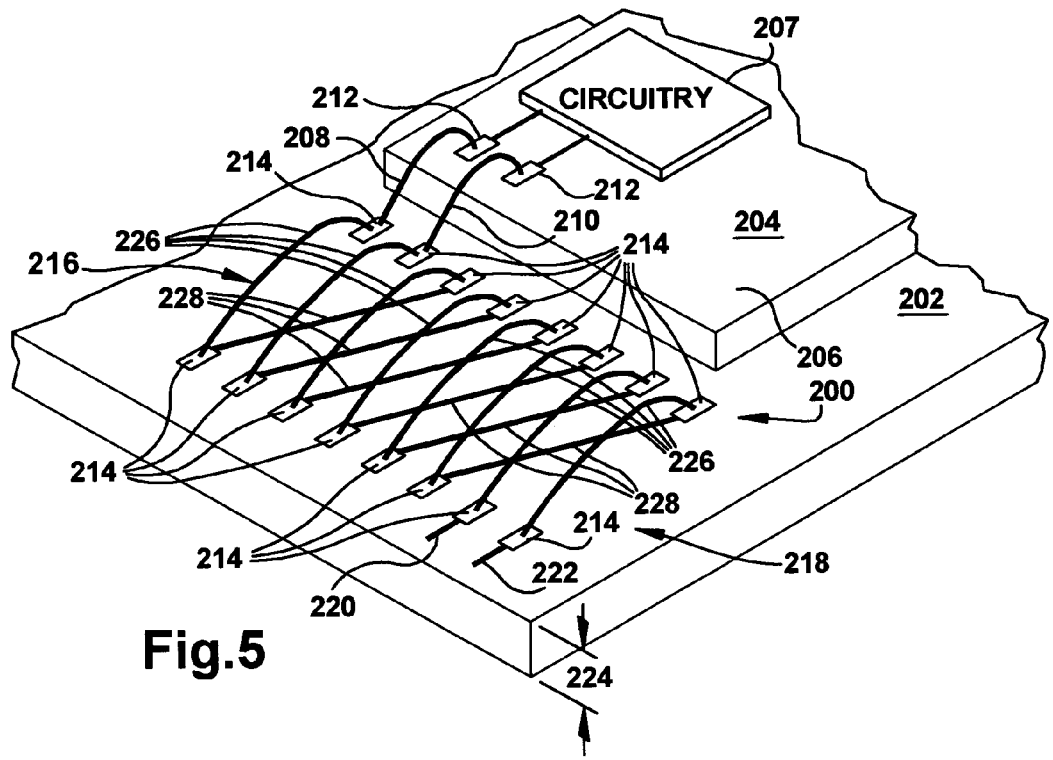
FIG. 5 depicts an example of a transformer coupled to circuitry on a die according to an aspect of the present invention.

FIG. 5 depicts an example of a transformer 200 built on a package substrate 202 in conjunction with a die 204. The die 204 corresponds to a chip cut from a wafer and attached to the package substrate 202. The die 204 includes a semiconductor substrate 206. As used herein, the term "semiconductor" corresponds to a material whose resistivity is between that of insulators and conductors. Examples of semiconductor materials include germanium, lead sulfide, lead telluride, selenium, silicon, gallium arsenide, and silicon carbide to name a few.

The die 204 may be attached to substrate. For instance, a lower surface of the die 204 can be attached to portion of the surface of the package substrate 202 or it may be attached to the package substrate within a die cavity formed in the substrate surface (e.g., a "cavity down" package). The die 204 has a surface area that is less than the surface area of the package substrate 202, such that at least a portion of the substrate surface remains exposed after attachment of the die to the substrate. Four typical ways that the die 204 can be attached to the package substrate include: alloy or eutectic bonding, solder attachment, low temperature glass frits, and adhesive bonding. The die 204 includes one or more electrical circuits formed on and/or in the die substrate 206 during a series of predefined processing steps. The complete IC package can include a single die or a multiple die, sometimes referred to as a multi-chip module having several die mounted onto the package substrate 202. The package substrate 202 can have a predetermined substantially constant thickness, indicated at 224.

In the example of FIG. 5, circuitry 207 on the die 204 is interconnected with the transformer 200 through bond wires 208 and 210 interconnecting respective bond pads 212 of the die 204 and bond fingers 214 on the package substrate 202. As shown in FIG. 5, the bond pads 212 can be formed on the surface of the die 204 in a desired arrangement near the edge or periphery of the die. The bond wires 208 and 210, for example, correspond to inputs to the transformer 200, namely, inputs to respective primary and secondary windings 216 and 218. The transformer 200 also includes corresponding outputs 220 and 222 implemented on the package substrate 202. The primary winding 216 thus includes the electrically conductive path between the input at 208 and the output at 220 and the secondary winding 218 includes the electrically path between the input at 210 and the output at 222. As one example, the circuitry 207 implemented on the die 204 can include an appropriate driver circuits or amplifier circuit coupled to provide a corresponding outputs to the respective inputs 208 and 210 via the bond pads 212.

The transformer 200 depicted in FIG. 5 is similar to the example of the transformer of FIG. 1. Briefly stated, each of the primary and secondary windings 216 and 218 includes a bond wires 226 connected between respective first and second pads 214. The bond wires 226 are connected in series with electrical traces 228 connected between other pad pairs, similar to that shown and described in FIG. 1. While the transformer 200 depicted in FIG. 5 is similar to the example transformer of FIG. 1, those skilled in the art will understand and appreciate that the transformer 200 can be implemented as any of the example types shown and described herein (see, e.g., FIGS. 2, 3 and 4). Additionally, while the example of the transformer 200 is depicted as including a single primary winding and a single secondary winding having inputs and outputs, it is to be understood and appreciated that different numbers of primary and/or secondary windings can be implemented in the transformer 200.

Figure 6:
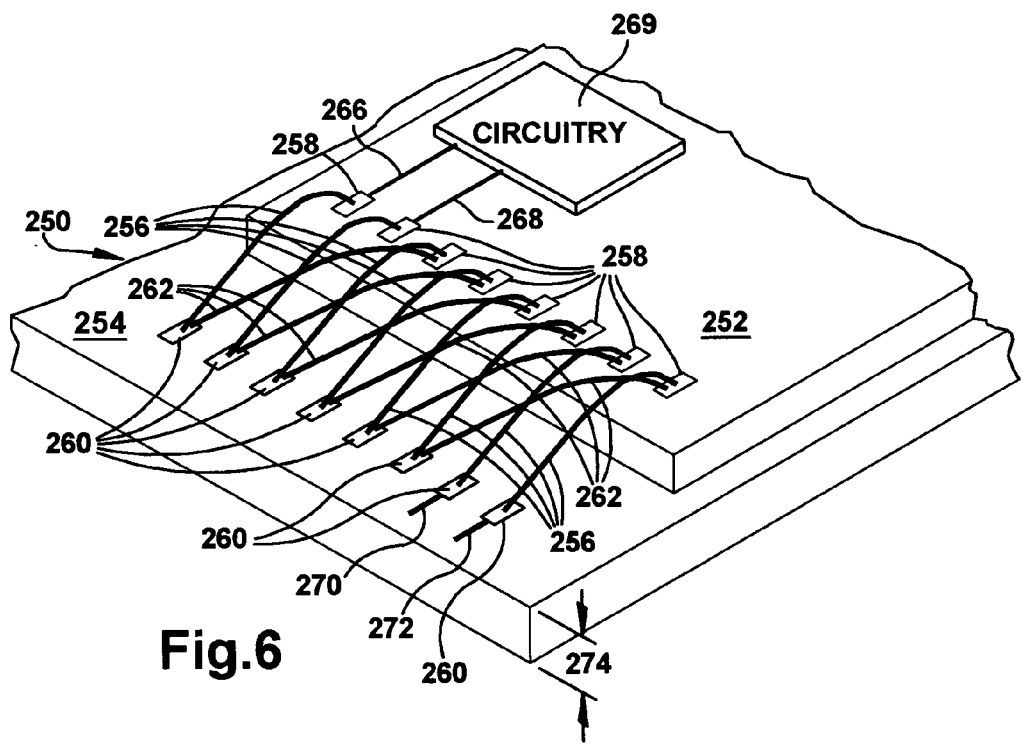
FIG. 6 depicts an example of a transformer constructed between a die and a package substrate according to an aspect of the present invention.

FIG. 6 depicts an example of a transformer 250 that interconnects a semiconductor die 252 and a package substrate 254. That is, the transformer 250 physically extends directly between the die 252 and the package substrate 254. The transformer 250 includes bond wires of a first loop height, indicated at 256. Each first bond wire 256 interconnects a pad pair, including a bond pad 258 and a bond finger 260. Bond wires of a second loop height 262 interconnect other pad pairs, including bond fingers 260 and bond pads 258. For example, the loop height of the bond wires 256 extends above the surface of the die 252 and the surface of the substrate 254 a distance that is greater (e.g., approximately 200 micrometers greater) than the maximum height of the second bond wires 262.

The transformer 250 thus includes a pair of inputs 266 and 268 and corresponding outputs 270 and 272. The inputs 266 and 268 of the transformer 250 can be coupled (e.g., via electrical traces on the semiconductor substrate 252) to corresponding circuitry 269 implemented in the die 252. The respective outputs 270 and 272 in turn can be provided to corresponding output pins of the package, such as through vias or through other circuit traces as is known in the art. The electrical path between the input 266 and the output 270 defines a first winding and the path between the input 268 and the output 272 defines another winding (either of which can be considered a primary or second winding).

The transformer 250 generally corresponds to the type of transformer shown and described in FIG. 2, namely, being formed of bond wires of different loop heights. The substrate 254 also has a thickness 274, which can vary according to the type of package and the size of the respective package (e.g., see Table 1 for a range of substrate thickness dimensions). Because one set of pads 258 are implemented on the die 252 (e.g., near the edge or periphery of the die) and the other set of pads are implemented on the package substrate 254, the overall size of the resulting package, including the integrated transformer 250, can be reduced relative to many other types of existing transformer circuits. Additionally, the circuitry 269 can include one or more semiconductor power amplifier circuits (e.g., CMOS amplifiers), such that corresponding amplifier can be integrated with the transformer into a single IC package. As packaging technology improves, the loop heights of the windings 256 and 262 further can be scaled down, such that further reductions in overall package size can be achieved.

Figure 7:
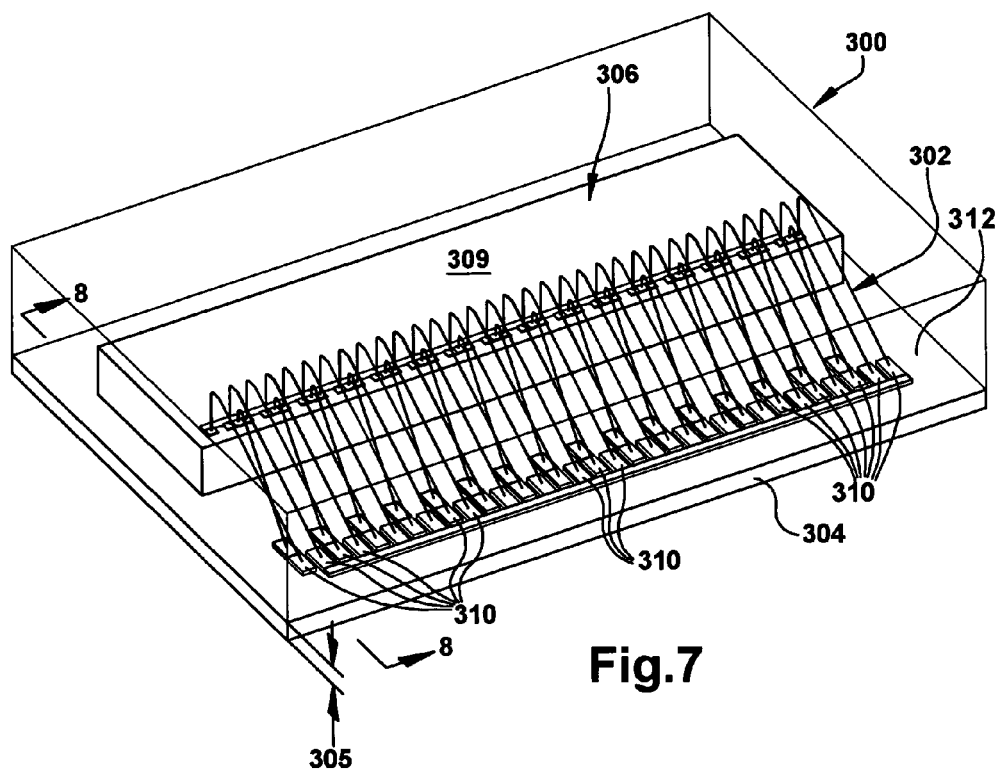
FIG. 7 depicts an isometric view of a transformer interconnected between a die and a package substrate according to an aspect of the present invention.
Figure 8:
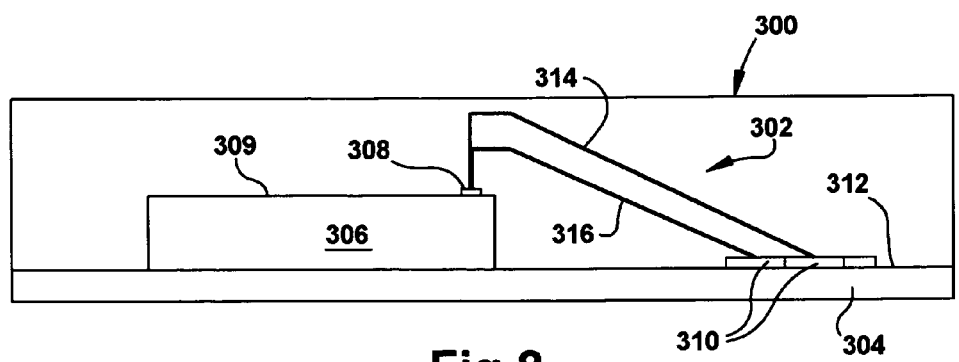
FIG. 8 depicts an example of the package of FIG. 7 taken along line 8-8.

FIGS. 7 and 8 depict an example of a partially constructed package 300 implementing a transformer 302 according to an aspect of the present invention. The package 300 includes a package substrate 304 having a suitable thickness, indicated at 305. A semiconductor die 306 is attached to the substrate 304, such as through a die attach operation (e.g., alloy or eutectic bonding, solder attachment, low temperature glass frits, adhesive bonding). Similar to the example of FIG. 6, the transformer 302 physically and electrically connects the die 306 and the substrate 304. The transformer 302 includes a plurality of wires interconnected between bond pads 308 on the die 306 and bond fingers 310 formed on the surface 312 of the substrate 304. The transformer 302 can include one or more primary windings and one or more secondary windings, which can vary to implement a desired transformer configuration.

Each primary and secondary winding includes an arrangement of one or more bond wires 314 having a first loop height and one or more bond wires 316 having a second loop height. That is, the first and second bond wires 314 and 316 are differentiated by the respective height of the wires relative to the die surface 308 and the substrate surface 312. As perhaps better shown in FIG. 8, the first bond wires 314 extend to a maximum height above the surface of the substrate 312 that is greater than the maximum distance between the second wire 316 relative to the substrate surface 312. For example, the difference between maximum loop heights can be approximately 200 micrometers, although other loop height differences can be utilized in the transformer 302.

A turn of a given winding thus can be formed of a length of a bond wire 314 connected between a bond pad 308 and a bond finger 310 with a second portion of the winding being formed of a length of the bond wire 316 between the same bond finger 310 and a different bond pad 308. The respective height between the bond wires 314 and 316 should be maintained substantially constant within packaging parameters. As described with respect of FIG. 6, two or more inputs of the transformer 302 can be coupled via corresponding traces into circuitry (not shown) of the die 306 and outputs of the transformer 302 can be coupled via electrical traces or via to corresponding output pins or pots or to other types of leads or solder balls, as is known or may become known in the art.

Figure 9:
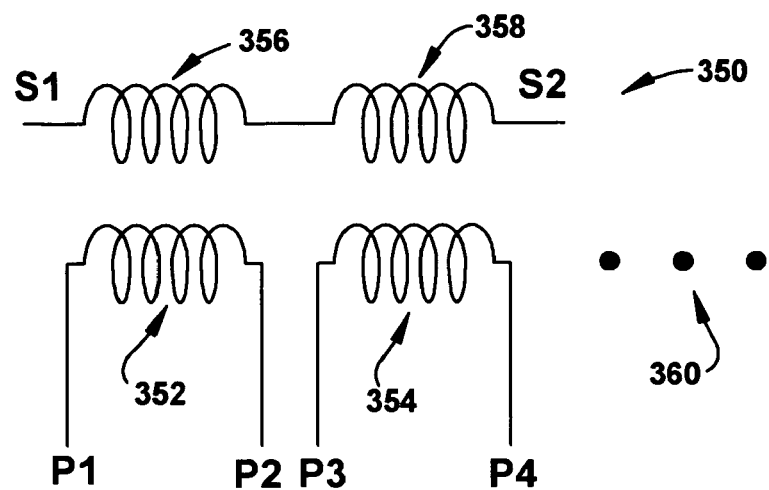
FIG. 9 depicts an example of a transformer schematic for implementing a power combiner or power splitter.

FIG. 9 depicts an example of a transformer network 350 that includes a plurality of primary windings 352 and 354. The primary winding 352 includes a pair of inputs P1 and P2 and the other primary winding 354 includes corresponding inputs P3 and P4. The respective windings 352 and 354 can be considered to be parallel windings having separate inputs, P1 through P4. The transformer network 350 includes an equal number of secondary windings 356 and 358 connected in series between respective outputs S1 and S2, such that magnetic coupling exists between each adjacent pair of windings. That is, each pair of corresponding windings 352 and 356, 354 and 358 of each transformer is coupled according to a coupling coefficient, which may be the same or different for each respective transformer.

While the example in FIG. 9 is shown as including two transformers, it is to be understood and appreciated that the transformer network 350 can include any number N of transformers as indicated by the ellipsis 360. For example, the transformer network 350 can include any number N of transformers in which the secondary set of windings 356 and 358 are connected in series between respective outputs S1 and S2. For example, the transformer can be implemented N 1:1 transformers, although other transformation ratios can also be utilized. The transformer network 350 can be implemented as a power combiner or, alternatively, as a power separator in which S1 and S2 are inputs.

In operation, for example, electrical current can be provided through each of the sets of primary windings 352 and 354 of the transformer network 350 with the electrical energy being coupled through respective magnetic fields from the primary windings to the corresponding secondary windings 356 and 358. In this mode of operation, a power combining function is implemented in which the amount of power provided at each of the primary windings is coupled to the secondary windings 356 and 358 and aggregated between the outputs S1 and S2 of the secondary windings. As an example, assuming one hundred percent coupling (e.g., k=1) between the respective windings and assuming two transformers in the transformer network 350, if 0.5 watt is applied to the transformer 352 and one-half watt applied to the transformer 354 the aggregate coupled power between S1 and S2 will equal approximately 1.0 watt. As the coupling between the respective windings decreases below the 100% ideal condition, the amount of power transferred from the primary windings 352 and 354 to the secondary windings 356 and 358 will decrease proportionately. Thus, in implementing the power combiner according to an aspect of the present invention, the expected actual coupling, which should be greater than 0.3, should be considered in providing suitable power at the outputs S1 and S2. Since the transformer network 350 can be implemented and integrated into an IC package, a predetermined number of multiple power amplifier stages can be implemented for driving respective primary windings to achieve a desired aggregate output power level between S1 and S2.

Figure 10:
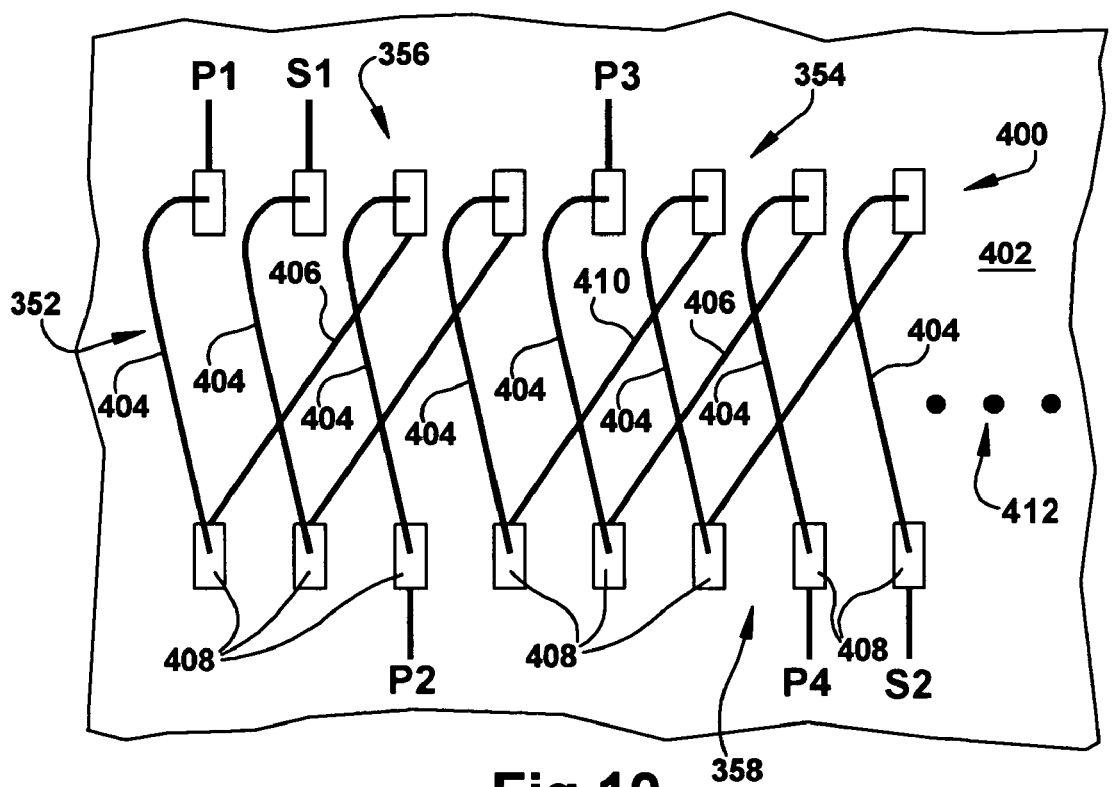
FIG. 10 depicts an example of the transformer of FIG. 9 implemented on a package substrate according to an aspect of the present invention.

FIG. 10 depicts an example of a transformer system 400 corresponding to the transformer network 350 shown schematically in FIG. 9. Accordingly, reference characters previously introduced in FIG. 9 are used to represent corresponding structure in the example transformer of FIG. 10. Accordingly, the inputs of the primary windings of the transformer 400 are indicated at P1, P2, P3 and P4, and the respective outputs of the secondary windings 356 and 358 are indicated at S1 and S2. The transformer system 400 is depicted as being implemented on a package substrate 402. It is to be understood and appreciated that the transformer 400 could equally be implemented by interconnecting the bond wires between a die and a package substrate, such as shown and described in FIGS. 6-8.

Referring between FIGS. 9 and 10, the primary winding 352 includes bond wires 404 connected between pairs of electrically conductive pads 408 and electrically conductive traces 406 connected between respective pads 408. For example, to provide for one and a half turns between P1 and P2, a bond wire connects a first pad (corresponding to P1) and a second pad that is spaced apart from and substantially opposing the first pad. A trace 406 connects the second pad with a third pad and another bond wire connects the third pad and a fourth pad (corresponding to P2). Similarly, the primary winding 354 includes electrically conductive path between P3 and P4 corresponding to bond wires 404 and electrically conductive pads 408 and an electrically conductive trace 406.

The secondary windings 356 and 358 are connected in series between S1 and S2. The secondary winding 356 is positioned adjacent the winding 352 to achieve a desired coupling. The secondary winding 356 includes bond wires 404 and an electrically conductive trace 406 between respective pads 408 to provide (in the example of FIG. 10) one and a half turns. The winding 356 is interconnected with the winding 358 through another electrically conductive trace 410, which is connected between respective pads 408 at the spatially proximal ends of the respective windings 356 and 358. The trace 410 corresponds to the node interconnecting the windings 356 and 358 in FIG. 9. The other secondary winding 358 includes bond wires 404 and a corresponding electrical trace 406 connected between respective pads 408 to provide the electrical path between S2 and the trace 410.

It is to be understood that other numbers of turns and arrangements of wires and traces, wires only can be utilized to form each of the primary and secondary windings. Additionally, each of the respective windings can include a lesser or greater number of windings from that shown and described herein. As indicated by the ellipsis 412, the respective transformer system 400 can include a greater number of transformers thereby providing N 1:1 transformers such that power can be transferred between the primary and secondary windings, such as for implementing a power combiner or for implementing a power separator.

Figure 11:
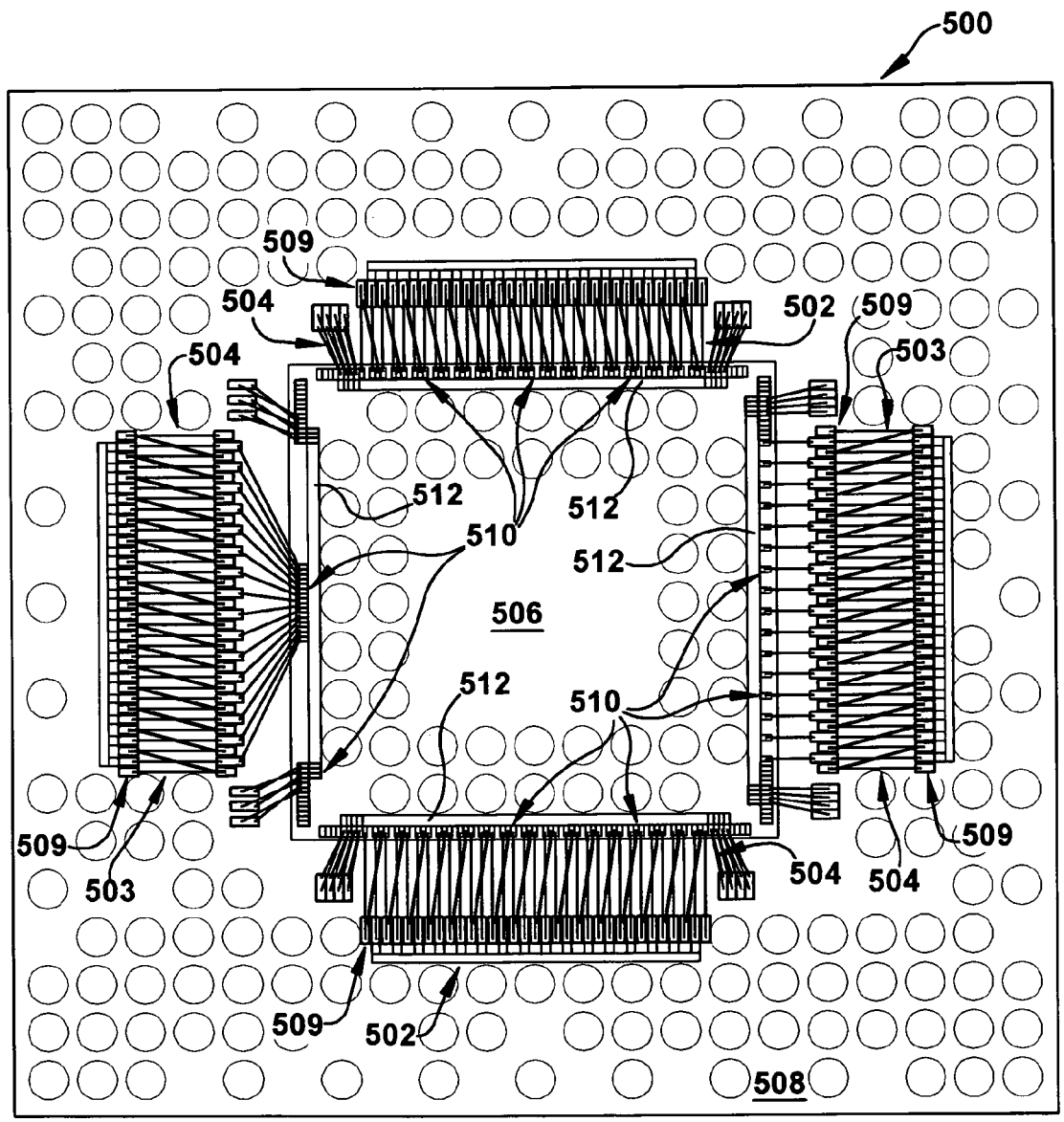
FIG. 11 depicts an example of a power combiner circuit that can be implemented in a package body according to an aspect of the present invention.

FIG. 11 depicts an example of a ball grid array package 500 that includes a plurality of transformers 502 implemented according to an aspect of the present invention. In the particular example of FIG. 11, the package 500 includes two 161:1 transformers 502, each transformer including an arrangement of bond wires 504 connected between the surface of a die (or bond pad) 506 and electrically conductive pads 509 at a surface of the package substrate 508. The package 500 also includes two other 161:1 transformers 503, each of which is implemented on the package substrate 508 with an arrangement of bond wires and electrical traces. The package 500, however, is not limited to any particular number or type of transformers. At the surface of the die 506, the bond wires 504 can be connected to bond pads 510, some of which correspond to inputs of respective transformers. Similarly, at the surface of the substrate 508, the bond wires and electrical traces can be connected to corresponding electrically conductive pads 509. Ground pads 512 are also shown on the die 506, which can be utilized for providing corresponding ground connections to the substrate 508 (e.g., via bond wires).

As an example, corresponding power amplifiers or other circuitry (not shown) can be implemented on the die 506 for driving the inputs of the respective transformers. For instance, the power amplifiers can include IC's formed of one or more transistors, such as may be configured to operate in Class A, AB, C, D, E or F modes. Thus, in an example where four transformers 502 and 503 are being driven by corresponding power amplifiers (e.g., implemented on the die 506), the secondary windings of the respective transformers can be connected in series via electrically conductive traces on the package substrate 508 and/or via bond wires 504 on the package substrate to aggregate the power from the respective secondary windings between corresponding output end terminals of the set of secondary windings. That is, the secondary windings of each of the respective transformers 502, 503 can be connected in series through electrical traces and/or bond wires implemented on the package substrate so that the respective end terminals of the set of serially connected secondary windings correspond to an aggregate of the electrical energy that is coupled to the secondary windings from the primary windings. Each of the respective primary windings can be separate or parallel windings, such as shown and described with respect to the examples of FIGS. 9 and 10.

In view of the foregoing, the present invention provides systems and methods to implement a low cost, high efficiency and low loss transformer. The transformers can be implemented utilizing existing as well as future wirebonding technology or a combination of such wirebonding technology in combination with substrate traces implemented using existing or future packaging technology. Thus, the approach described herein can be utilized to implement a 1:1 transformer. Additionally or alternatively, the approach as shown and described herein can be utilized to implement an N n1:n2 transformer system where the primary or secondary windings can be connected in series. Thus, the approaches described herein are applicable to implementing a power combiner such as for power amplifier applications, low noise amplifier designs, transformers coupled to VCO, etc. Alternatively, the approach can be applied to implement a power separator in which the power is initially applied to the serially connected set of windings and separated via coupling to the corresponding parallel sets of primary windings. Those skilled in the art will understand and appreciate that the various dimensions and techniques for implementing the transformer will vary generally depending upon the type of IC packaging being implemented.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A transformer system, comprising:
   a package substrate having a substantially planar surface;
   a plurality of electrically conductive pads arranged in spaced apart relationship relative to each other;
   a first winding defined by a first electrically conductive path between a first input and a first output, the first electrically conductive path including at least one wire connected between at least one first pad pair of the electrically conductive pads, at least one electrically conductive pad of each first pad pair being at the substrate surface;
   a second winding defined by a second electrically conductive path between a second input and a second output, the second electrically conductive path including at least one wire connected between at least one second pad pair of the electrically conductive pads, at least one electrically conductive pad of each second pad pair being at the substrate surface;
   a semiconductor die having substantially opposing first and second surfaces, the first surface being spaced apart from the substrate surface, the second surface being attached to a portion of the substrate; and
   wherein the plurality of electrically conductive pads includes at least a first pad set located at the substrate surface and at least a second pad set located at the first surface of the die, the first pad set and the second pad set being arranged in juxtaposition relative to each other, at least two pads of the first pad set being connected with corresponding electrically conductive pads of the second pad set by wires and the first and second electrically conductive paths being proximal each other to achieve a magnetic field coupling between the first and second windings so as to form a transformer.

2. The system of claim 1, wherein the wires that interconnect the at least two pads of the first pad set and the corresponding pads of the second pad set are inputs to the transformer formed by the first winding and the second winding.

3. The system of claim 1, wherein each of the first winding and the second winding further comprises bond wires connected between respective pad pairs, each of the respective pad pairs including one pad from the first pad set and one pad from the second pad set.

4. The system of claim 3, wherein a first set of the bond wires has a loop height relative to the substrate surface that is greater than a loop height of a second set of the bond wires, each of the first winding and the second winding including a portion of the first set of bond wires and a portion of the second set of bond wires.

5. The system of claim 1, wherein the coupling between the first and second windings corresponds to a coefficient of magnetic field coupling that is greater than approximately 0.3.

6. The system of claim 1, wherein the at least one wire of the first winding further comprises multiple wires connected between the at least one first pad pair.

7. The system of claim 1, further comprising:
   at least one third winding defined by a third electrically conductive path between a third input and a third output, the third electrically conductive path including at least one wire connected between at least one third pad pair of the electrically conductive pads;
   at least one fourth winding defined by a fourth electrically conductive path between a fourth input and a fourth output, the fourth electrically conductive path including at least one wire connected between at least one fourth pad pair of the electrically conductive pads, the third and fourth electrically conductive paths being proximal each other to achieve a magnetic field coupling between the third and fourth windings to form at least another transformer, the output of the second winding being electrically connected with the input of the fourth winding such that the second winding and the fourth winding are electrically connected in series, the first and third windings being separate from each other.

8. The system of claim 7, further comprising one of a bond wire or an electrical trace electrically connecting the second winding and the fourth winding in series.

9. The system of claim 1, wherein the package substrate comprises an electrical insulator material.

10. A transformer system, comprising:
- a die comprising first and second substantially opposed surfaces and a plurality of electrically conductive die pads arranged in spaced apart relationship relative to each other at a first surface of the die;
- a substrate formed of an insulator material having a substantially planar surface and a plurality of electrically conductive substrate pads arranged in spaced apart relationship relative to each other at the substrate surface, the die being attached to the substantially planar substrate surface;
- a first winding that includes wire connecting a first subset of the die pads with a first subset of the substrate pads; and
- a second winding that includes wire connecting a second subset of the die pads with a second subset of the substrate pads, the wire of the first winding being positioned adjacent respective wire of the second winding to form a transformer.

11. The system of claim 10, wherein at least two die pads at the first surface of the die define inputs of the transformer.

12. The system of claim 10, wherein the wire in each of the first winding and the second winding further comprise bond wires connected between respective pad pairs, each of the respective pad pairs including one die pad and one substrate pad.

13. The system of claim 12, wherein a first set of the bond wires has a loop height relative to the substrate surface that is greater than a loop height of a second set of the bond wires, each of the first winding and the second winding including a portion of the first set of bond wires and a portion of the second set of bond wires.

14. The system of claim 10, wherein the coupling between the first and second windings corresponds to a coefficient of magnetic field coupling that is greater than approximately 0.3.

15. The system of claim 10, wherein the transformer is a first transformer, the system further comprising:
- at least one third winding that includes wire connecting a third subset of the die pads with a third subset of the substrate pads; and
- at least one fourth winding that includes wire connecting a fourth subset of the die pads with a fourth subset of the substrate pads, the wire of the third winding being positioned adjacent respective wire of the fourth winding to form a second transformer, an output of the second winding being electrically connected with an input of the fourth winding such that the second winding and the fourth winding are electrically connected in series, the first winding and the third winding being separate from each other.

16. The system of claim 15, further comprising one of a bond wire or an electrical trace electrically connecting the second winding and the fourth winding in series.

* * * * *